United States Patent [19]
Tanaka

[11] Patent Number: 5,142,765
[45] Date of Patent: Sep. 1, 1992

[54] LEAD MOUNTING APPARATUS

[75] Inventor: Kenji Tanaka, Ootsu, Japan

[73] Assignee: Rohm Co., Ltd., Kyoto, Japan

[21] Appl. No.: 796,798

[22] Filed: Nov. 25, 1991

[30] Foreign Application Priority Data

Dec. 7, 1990 [JP] Japan .................................. 2-407275
Dec. 11, 1990 [JP] Japan .................................. 2-410235

[51] Int. Cl.$^5$ ...................... B23P 23/00; H01R 43/04
[52] U.S. Cl. ................................... 29/564.6; 72/105
[58] Field of Search ............... 29/564.6, 566.1, 566.2, 29/566.3, 33 M, 827, 564.2, 564.7, 739; 72/105

[56] References Cited

U.S. PATENT DOCUMENTS

| 4,523,378 | 6/1985 | Evans | 29/564.6 X |
| 4,551,901 | 11/1985 | Bonifanti et al. | 29/564.6 |
| 4,642,872 | 2/1987 | Grabbe | 29/566.2 X |

FOREIGN PATENT DOCUMENTS

| 33856 | 2/1984 | Japan | 29/827 |
| 143225 | 6/1989 | Japan | 29/827 |
| 8503022 | 7/1985 | World Int. Prop. O. | 29/564.6 |

Primary Examiner—William Briggs
Attorney, Agent, or Firm—William H. Eilberg

[57] ABSTRACT

A lead mounting apparatus is used for mounting leads to an electronic component by utilizing a leadframe which comprises a side band formed integrally with leads each having a clip end portion. The apparatus comprises a transfer mechanism for transferring the leadframe with the respective clip end portions directed upward and located above the component which is supported on one side of the leadframe transfer path; a cutter for cutting the leadframe to provide a frame segment which contains a predetermined number of leads; an operating head arranged ahead of the cutter means on the other side of the leadframe transfer path in opposition to the electronic component to move toward and away from the electronic component; and a row of lead resting teeth provided on the operating head for supporting the frame segment with the clip end portions thereof vertically aligned with the electronic component.

10 Claims, 7 Drawing Sheets

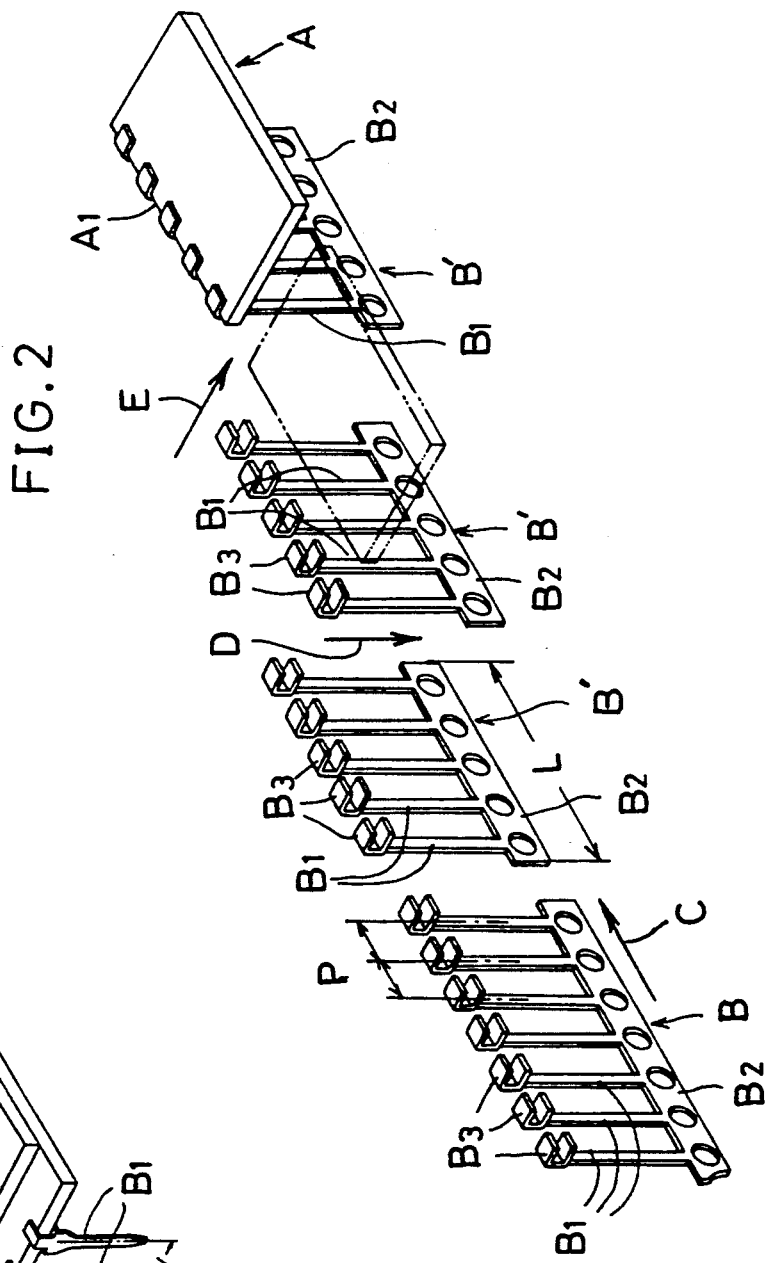

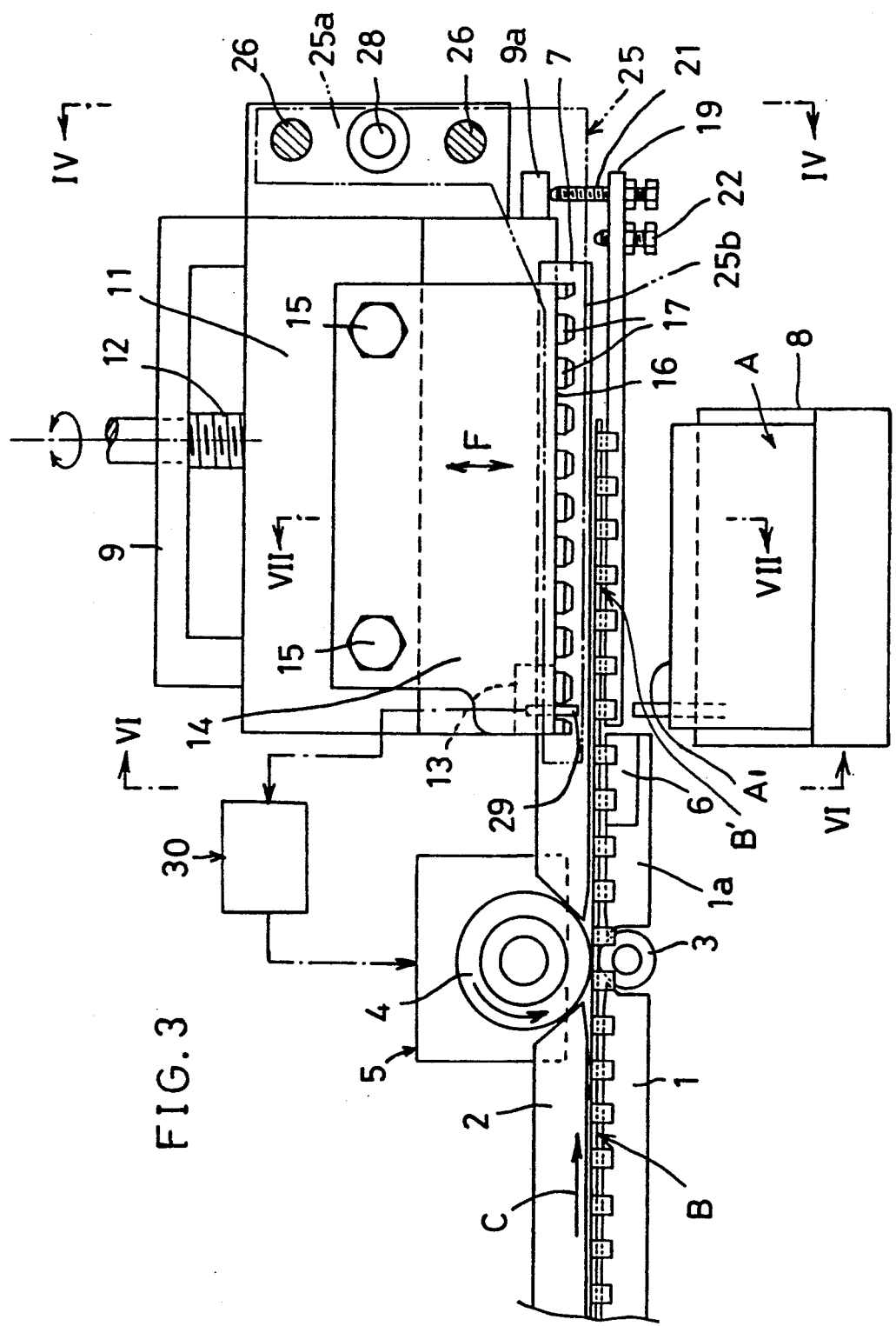

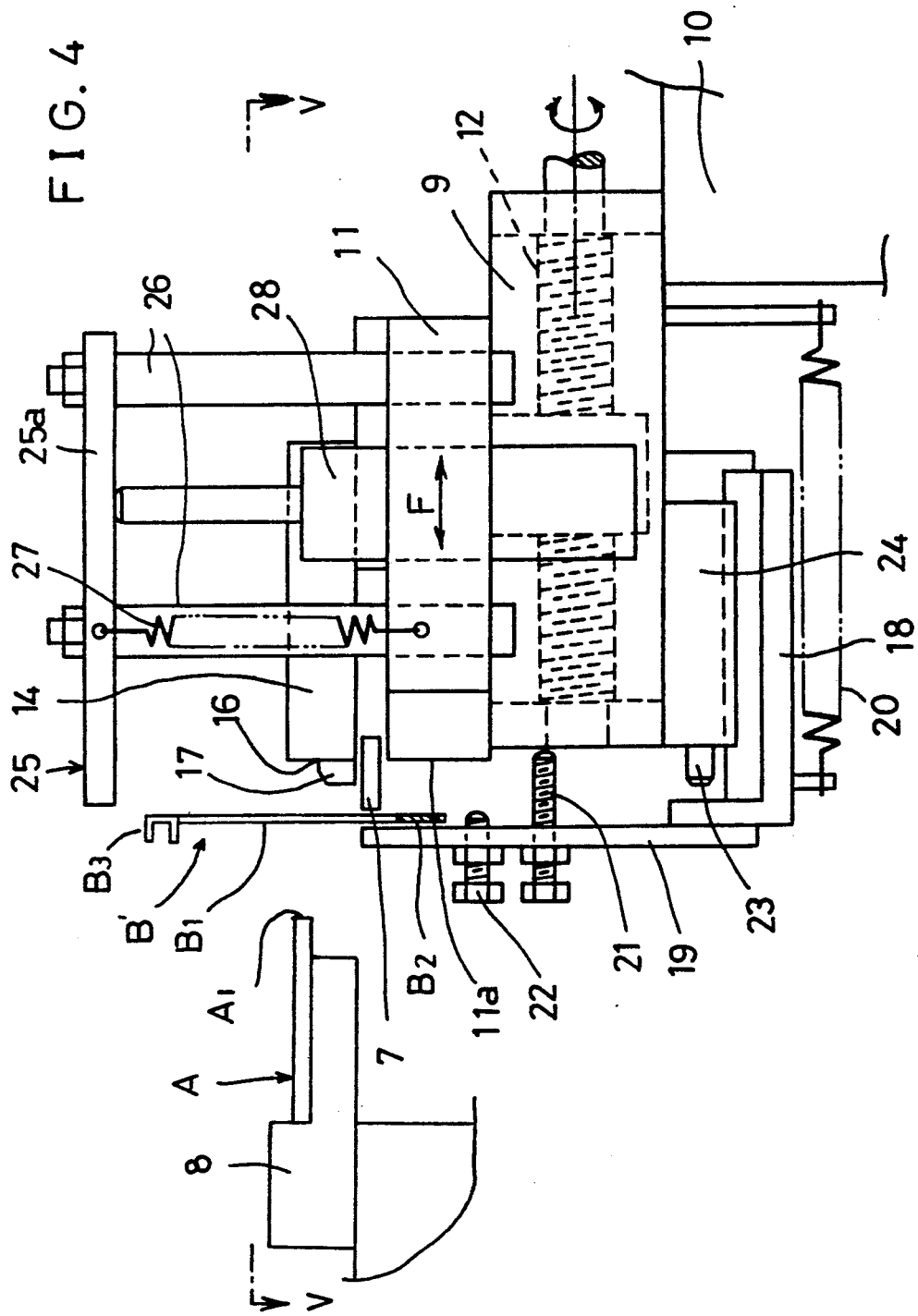

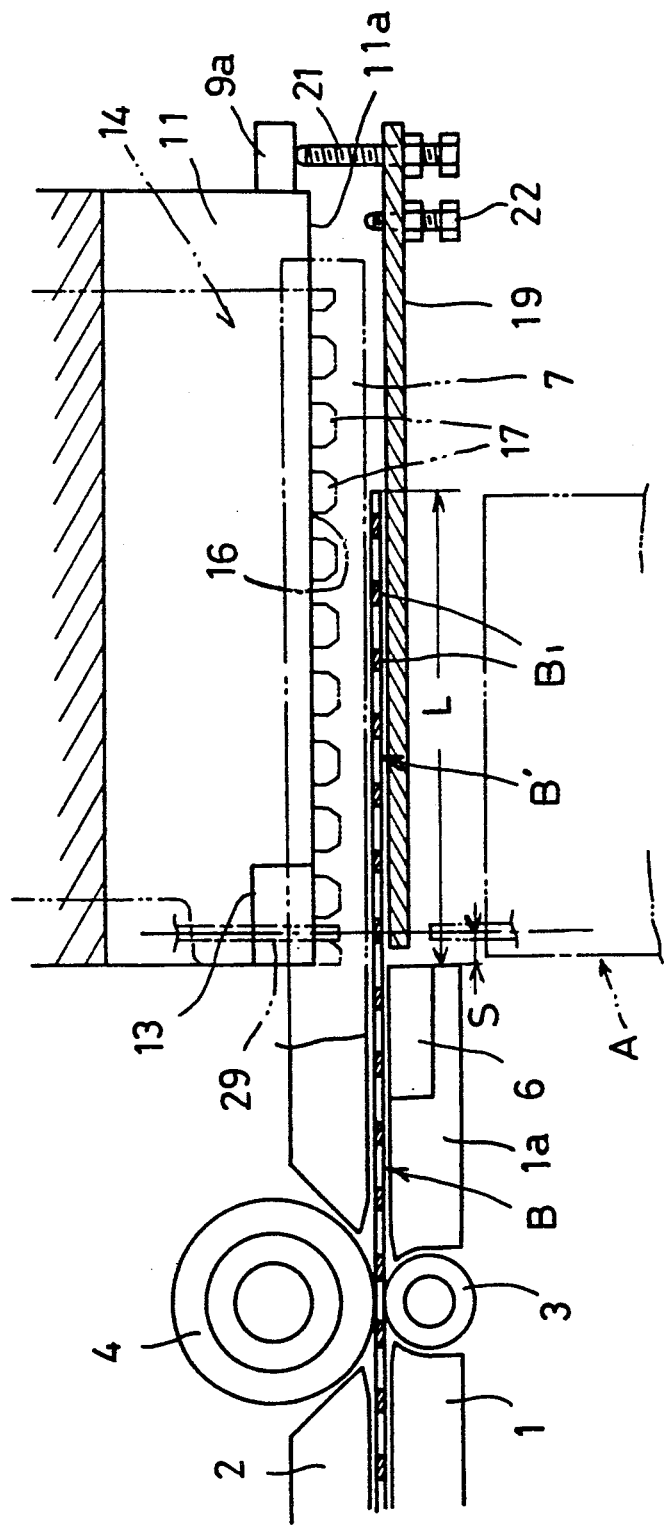

LEAD MOUNTING APPARATUS

BACKGROUND OF THE INVENTION

1. Field of the Invention

This invention relates to a lead mounting apparatus which is used in the production of electronic components for example. More specifically, the present invention relates to an apparatus for mounting leads to an object, particularly an electronic component such as liquid crystal display device or printed circuit board, requiring lead connection.

2. Description of the Prior Art

Conventionally, in mounting leads to an electronic component (e.g. liquid crystal display device and printed circuit board), use is made of a leadframe which comprises a longitudinal side band integrally formed, substantially at constant spacing, with leads. Each of the leads has a clip end portion which is used for attachment to the electronic component.

Specifically, in the process of lead mounting, the leadframe is transferred by a transfer mechanism acting on the frame side band in a manner such that the respective clip end portions of the leadframe are vertically aligned with the electronic component which is supported at a predetermined height. During transfer, the leadframe is cut to provide a frame segment which contains a predetermined number of leads required for the electronic component. Subsequently, the frame segment is advanced toward the electronic component until the respective clip end portions are brought into fitting engagement with a marginal portion of the electronic component.

As is well known, there are various types of electronic components which require connection to leads, and the length of the respective leads must be determined to suit the particular type of electronic component. Thus, different types of leadframes must be processed for manufacturing different types of electronic components.

According to the prior art wherein the leadframe is transferred with the respective clip end portions vertically aligned with the supported electronic component being processed, at least the height of guide rails for leadframe transfer and a support for the electronic component must be re-adjusted if the leadframe is replaced by another which has a different lead length. Such re-adjustment requires use of a lead mounting apparatus which is designed to provide positional adjustability, thus complicating the apparatus and rendering the apparatus bulky. Further, the operation of re-adjustment requires a lot of time, consequently resulting in production cost increase.

SUMMARY OF THE INVENTION

It is, therefore, an object of the invention to provide a lead mounting apparatus which is applicable to various types of leadframes having different lead lengths without adjusting the height of guide rails or other related parts.

Another object of the present invention is to provide a lead mounting apparatus which does not necessitate modification or replacement of transfer means even if the leadframe is replaced by another which is different in lead pitch.

According to the present invention, there is provided an apparatus for mounting leads to an object, particularly an electronic component, requiring lead connection by utilizing a leadframe which comprises a side band formed integrally with leads substantially at constant pitch, each lead having a clip end portion, the apparatus comprising: transfer means for transferring the leadframe with the respective clip end portions directed upward and located above the object which is supported on one side of the leadframe transfer path; cutter means for cutting the leadframe to provide a frame segment which contains a predetermined number of leads required for the object, the frame segment being allowed to descend after the cutting; an operating head arranged ahead of the cutter means on the other side of the leadframe transfer path in opposition to the supported object, the operating head being movable toward and away from the object; and lead resting means provided on the operating head for limiting descending movement of the frame segment and supporting the frame segment with the clip end portions thereof vertically aligned with the object.

Preferably, the lead resting means comprises a row of lead resting teeth insertable between the leads of the frame segment with the clip end portions supported on the lead resting teeth. In this case, the row of lead resting teeth has an additional function of positionally adjusting the frame segment relative to the supported object.

Obviously, the descending movement of the frame segment may be performed by utilizing gravitational falling of the frame segment itself. However, it is more advantageous that the lead mounting apparatus further comprises a presser member located above the head and the frame segment for forcibly depressing the frame segment until the lead clip end portions thereof rest completely on the lead resting means. In this case, no problem occurs even if the frame segment falls incompletely due to frictional engagement between the leads of the frame segment and the lead resting teeth.

Further, according to a preferred embodiment of the present invention, the lead mounting apparatus further comprises a sensor for counting the leads which have been transferred past the cutter means, and a controller responsive to the sensor for interrupting the transfer means when the sensor has counted a predetermined number of leads. Such an arrangement enables accurate feeding, by a predetermined amount each time, of the leadframe even if there occurs slip deviation between the transfer means and the leadframe. Thus, it is possible to constitute the transfer means by a pair of non-toothed transfer rollers for frictionally feeding the leadframe therebetween. Obviously, the frictional transfer rollers can be used for transferring any types of leadframes even if the pitch between the leads differs from frame to frame.

Other objects, features and advantages of the present invention will be fully understood from the following detailed description given with reference to the accompanying drawings.

BRIEF DESCRIPTION OF THE DRAWINGS

In the accompanying drawings:

FIG. 1 is a perspective view showing a liquid crystal display device to which leads are mounted;

FIG. 2 is a perspective view schematically showing the successive steps of mounting the leads to the display device;

FIG. 3 is a plan view showing a lead mounting apparatus embodying the present invention;

FIG. 4 is a front elevational view of the same apparatus as seen in the direction of arrows IV—IV in FIG. 3;

FIG. 5 is a sectional view taken on lines V—V in FIG. 4;

DETAILED DESCRIPTION

Figure 6:
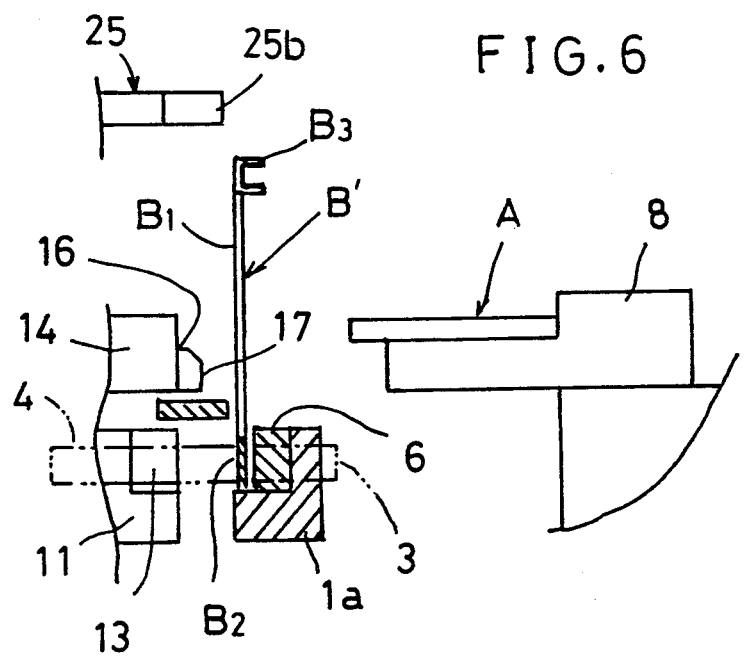
FIG. 6 is a sectional view taken along lines VI—VI in FIG. 3.
Figure 7:
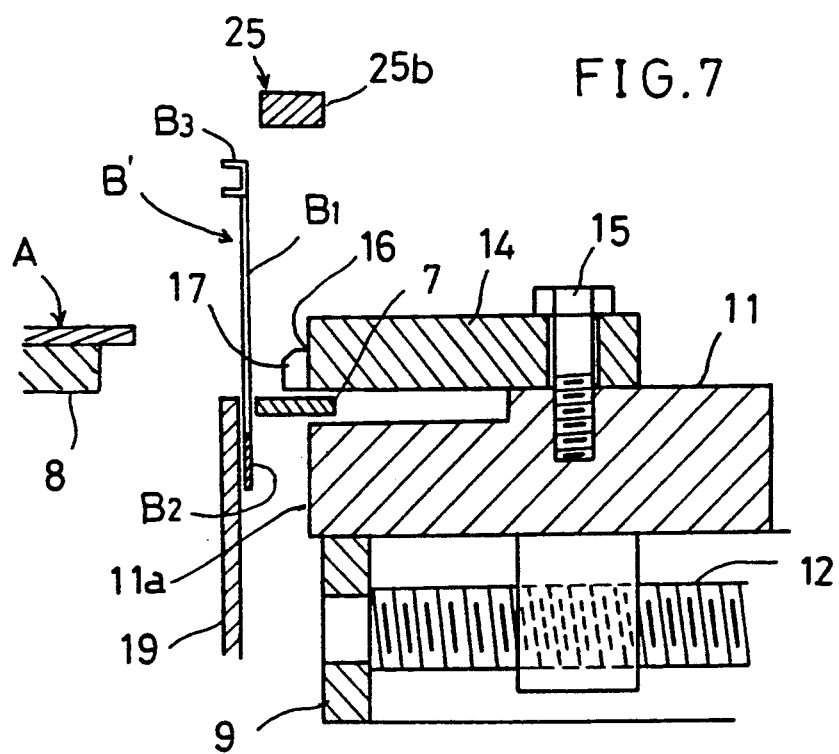
FIG. 7 is a sectional view taken along lines VII—VII in FIG. 3.

The present invention is specifically described below taking an example wherein a suitable number of leads B1 are mounted to a specific marginal portion (mounting marginal portion) A1 of a liquid crystal display device A, as shown in FIG. 1. However, the present invention may be also utilized to mount similar leads to any electronic components, including circuit boards, which require connection to the leads.

According to the present invention, use is made of a substantially continuous leadframe B for successively supplying leads B1, as shown in FIG. 2. Specifically, the leadframe B has a side band B2 integral with the leads B1 arranged at suitable pitch P. Each lead B1 has a tip end formed with a clip portion B3. It should be appreciated that the clip portion B3, which is only schematically shown in FIG. 2, may actually have such a configuration as shown in FIG. 1.

Roughly speaking, a lead mounting apparatus according to the present invention performs intended lead mounting in the following manner (see FIG. 2). First, the apparatus transfers the leadframe B in the direction of an arrow C in a manner such that the leads B1 are directed vertically upward with the respective clip end portions B3 positioned above the display device A which is horizontally supported. Secondly, the leadframe B is cut to provide a frame segment B' of a length L which contains a predetermined number of leads B1 required for the display device A. Then, the frame segment B' is caused to descend to a position at which the respective lead clip portions B3 of the frame segment are vertically aligned with the mounting marginal portion A1 of the display device A, as indicated by an arrow D. Thereafter, the frame segment B' is caused to advance for fitting the respective lead clip portions B3 onto the mounting marginal portion A1 of the display device A, as indicated by an arrow E. Finally, the side band B2 of the frame segment B' is cut off the thus mounted leads B1 in a known manner.

FIG. 3 illustrates the lead mounting apparatus according to one embodiment of the present invention. The apparatus comprises a pair of guide rails 1, 2 for guiding the leadframe B which is transferred in the arrow C direction by a pair of non-toothed transfer rollers 3, 4 held in frictional contact with the leadframe. One transfer roller 4 is driven by a drive mechanism 5 which is controlled by a controller 30.

One guide rail 1 is associated with a shorter rail extension 1a, whereas the other guide rail 2 is associated with a longer rail extension 7. The shorter guide extension 1a carries a first cutter member 6.

A support base 8 is arranged ahead of the shorter extension 1a and on one side of the leadframe transfer path for horizontally supporting the liquid crystal display device A being processed. A machine frame 9 is arranged on the other side of the leadframe transfer path in opposed relation to the support base 8.

As shown in FIG. 4, the machine frame 9 is fixedly supported on a machine base 10. A first reciprocative member 11 is slidably supported on the machine frame 9 to move back and forth perpendicularly to the longitudinal direction of the leadframe B, as indicated by an double-headed arrow F. The slidable reciprocation of the first reciprocative member 11 is effected by reversible rotation of a feed screw 12 which is rotatably supported by the machine frame 9 and connected to an unillustrated drive mechanism.

As shown in FIGS. 3-5, the first reciprocative member 11 carries a second cutter member 13 arranged at a cooperative position relative to the first cutter member 6. When the first reciprocative member is advanced, the side band B2 of the leadframe B is cut to provide a frame segment B'. Further, the first reciprocative member is provided, on its upper surface, with an operating head 14 which is removably fixed by means of bolts 15 (see FIG. 3).

The operating head 14 has a front pressing face 16 which extends longitudinally of the leadframe B and is provided with a row of lead resting teeth 17 disposed in a comb-like arrangement. The teeth row 17 is roughly at the same level as the display device A placed on the support base 8. Strictly, however, the teeth row 17 is slightly lower than the display device, as described hereinafter. The respective teeth 17 are insertable between the respective leads B1 of the frame segment B' when the head 14 on the first reciprocative member 11 is advanced. In the illustrated embodiment, the lead resting teeth serve as a means for limiting descending movement of the frame segment and for accurately positioning the frame segment relative to the display device A, as also described hereinafter.

On the underside of the machine frame 9, there is provided a second reciprocative member 18 which is slidable back and forth perpendicularly to the longitudinal direction of the leadframe B. The second reciprocative member 18 carries an upright guide plate 19 located between the support base 8 and the leadframe. The guide plate 19 extends longitudinally of the leadframe.

As shown in FIG. 4, the second reciprocative member 18 together with the guide plate 19 is always urged in a returning direction by a spring 20 acting between the machine frame 9 and the second reciprocative member. However, the guide plate 19 is provided with a first stopper bolt 21 which comes into abutment with a lateral projection 9a (see FIG. 3 or 5) of the machine frame 9, so that a clearance is formed between the guide plate 19 and the longer guide extension 7 to allow movement of the leadframe B (frame segment B'). Similarly, the guide plate 19 is also provided with a second stopper bolt 22 which comes into abutment with the front face 11a of the first reciprocative member 11 in its advanced position, so that another clearance is formed between the guide plate 19 and the first reciprocative member to allow movement of the leadframe B.

The second reciprocative member 18 together with the guide plate 19 is held advanced by a cylinder device 24 mounted to the underside of the machine frame 9. The cylinder device 24 has a cylinder rod 23 adapted to act on the second reciprocative member 18.

Above the operating head 14 is arranged an L-shaped presser bar 25. This presser bar has a base portion 25a which is vertically slidable on a pair of guide rods 26 (see FIGS. 3 and 4) upstanding from the first reciprocative member 11. The presser bar further has a presser portion 25b extending longitudinally of the leadframe B in substantial alignment with the teeth row 17.

As shown in FIG. 4, the presser bar 25 is always biased downward by a spring 27 arranged between the first reciprocative member 11 and the presser bar 25. However, the presser bar can be moved upward by a cylinder device 28.

As shown in FIGS. 3 and 5, the longer guide extension 7 is provided with a sensor 29 for detecting the respective leads B1 of the leadframe B at a position which forwardly deviates by a small amount S from the cutting position provided by the respective cutter members 6, 13. The detection signals from the sensor 29 are fed to the controller 30 for controlling the drive mechanism 5. Specifically, when the sensor 29 counts up a predetermined number of leads B1 required for the supported display device A, the drive mechanism 5 is caused to stop transfer movement of the leadframe B.

It should be appreciated that the lead mounting apparatus of the present invention is intended to be applied to various kinds of leadframes which may differ in various parameters such as lead spacing (pitch between leads) and lead length. It is therefore preferable that the deviating amount S for the sensor 29 be set about half the smallest possible pitch P (see FIGS. 1 and 2). In this way, the cutter members 6, 13 may be reliably caused to cut the side band B2 at a position between two adjacent leads B1 with respect to any kinds of leadframes to which the lead mounting apparatus of the present invention is applicable.

The lead mounting apparatus described above operates in the following manner.

Initially, both of the first and second reciprocative members 11, 18 assume their respective retreated positions, as shown in FIGS. 3-7. In this condition, the first reciprocative member 11 and the operating head 14 are spaced from the leadframe B which is transferred by the respective transfer rollers 3, 4 (see FIG. 3), and the presser portion 25b of the presser member 25 is located above but slightly behind the leadframe (see particularly FIGS. 6 and 7). Further, the first stopper bolt 21 is held in abutment with the machine frame 9 (see FIGS. 3 and 5), so that the guide plate 19 is slightly spaced from the longer guide extension 7 to allow passage of the leadframe B (see particularly FIG. 7).

During transfer of the leadframe B, the sensor 29 (see FIGS. 3 and 5) is caused to successively count the leads B1 which have advanced past the cutting position provided by the respective cutter members 6, 13. When the sensor 29 counts up a predetermined number of leads B1 required for the single display device A on the support base 8 (namely, when the transferred length of the leadframe becomes equal to a predetermined value L), the controller 30 causes stoppage of the drive mechanism 5 (see FIG. 3), thereby interrupting transfer movement of the leadframe.

Figure 8:
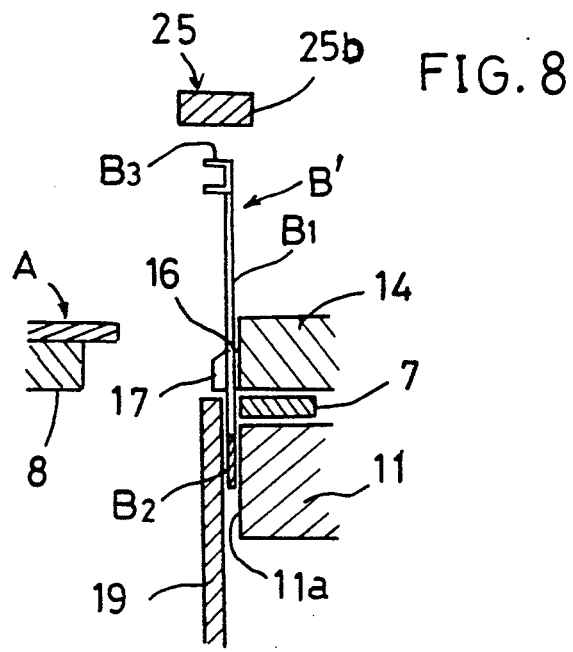
FIGS. 8 through 12 are sectional views similar to FIG. 7 but showing the successive steps of mounting the leads to the display device.

Then, the first reciprocative member 11 together with the head 14 thereon is advanced toward the display device A, as shown in FIG. 8. During advancing movement of the first reciprocative member, the respective lead resting teeth 17 are inserted between the respective leads B1, whereas the front face 11a of the first reciprocative member 11 comes into abutment with the second stopper bolt 22 (see FIGS. 3 and 5). Further, the presser portion 25b of the presser member 25 is brought to a position immediately above the leadframe B (B').

Figure 9:
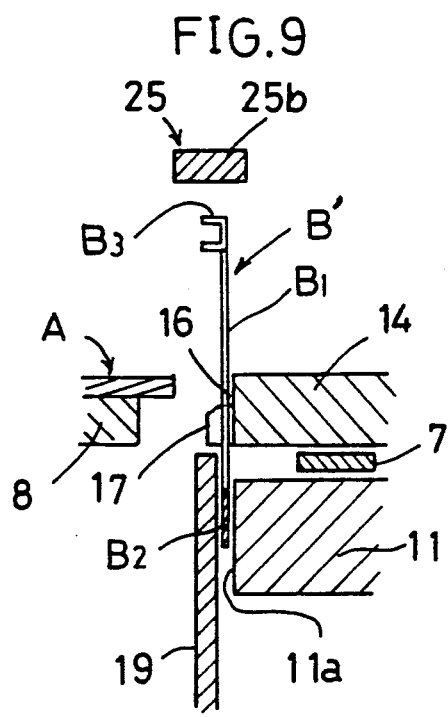

Due to the abutment between the first reciprocative member 11 and the second stopper bolt 22 (FIGS. 3 and 5), the guide plate 19 advances with the first reciprocative member against the spring 20 (FIG. 4) while a small clearance is maintained between the guide plate and the first reciprocative member, as shown in FIG. 9. Thus, when the frame segment B' is cut off the remaining portion of the leadframe B by the respective cutter members 6, 13 (see FIGS. 3, 5 and 6) upon subsequent advancing movement of the first reciprocative member 11, the frame segment B' is allowed to fall spontaneously within the small clearance between the guide plate 19 and the first reciprocative member 11.

Figure 10:
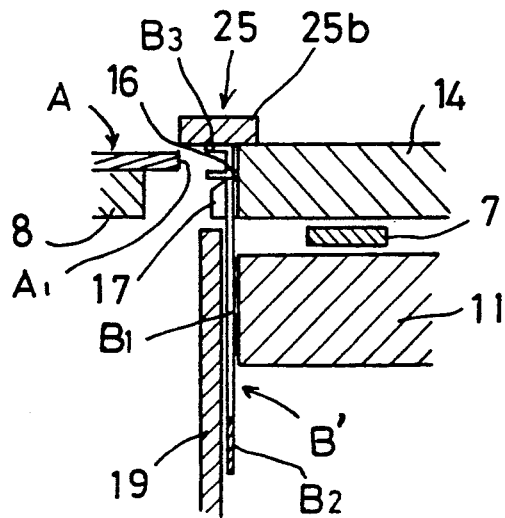

As a result, the frame segment B' falls until the clip end portions B3 of the respective leads B1 of the frame segment B' rest on the lead resting teeth 17, as shown in FIG. 10. In this condition, the clip end portions B3 are vertically aligned with the display device A because the lead resting teeth 17 themselves are located slightly below the display device A, as already described. At this time, it is possible that the frame segment B' falls incompletely due to friction between the leads B1 and the lead resting teeth 17 for example. Thus, to insure complete falling or descending of the frame segment B', the presser portion 25b of the presser member 25 may be lowered under the urging force of the spring 27 (see FIG. 4) by actuating the cylinder device 28 to forcibly press the frame segment downward.

Subsequently, the first reciprocative member 11 is further advanced together with the operating head 14 and the guide plate 19. As a result, the front pressing face 16 of the head 14 presses the lead clip portions B3 into fitting engagement with the display device A, as shown in FIG. 11.

Figure 11:
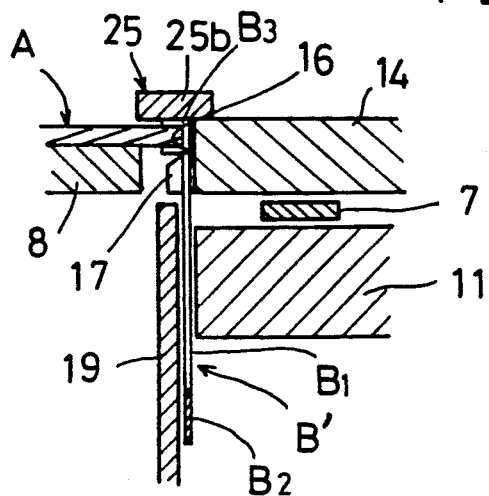
Figure 12:
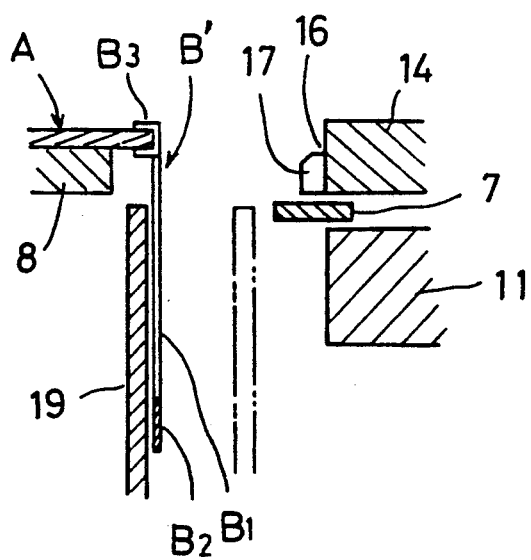

After mounting the leads B1 to the display device A, the cylinder device 24 (see FIG. 4) is actuated to protract the rod 23 into abutment with the second reciprocative member 18, thereby continuing to hold the guide plate 19 in the position of FIG. 11. On the other hand, the first reciprocative member 11 is retreated with the head 14 to the initial position, as shown in FIG. 12. Obviously, if the guide plate 19 is retreated with the first reciprocative member 11, the mounted leads B1 will be disengaged from the display device A. Thus, it is necessary to keep the guide plate 19 alone even at the time of retreating the first reciprocative member 11.

Finally, the display device A together with the mounted leads B1 is removed from the support base 8, and the guide plate 19 is returned to the initial position (indicated by phantom lines in FIG. 12) after removal of the processed display device A.

The above process steps may be repeated after a new display device (not shown) is placed on the support base 8.

According to the embodiment described above, the following advantages are obtainable.

(1) The leadframe B is transferred with the respective clip portions B3 held at a higher level than the display device A, and, after cutting the frame segment B' off the leadframe, the frame segment B' is allowed to fall onto the lead resting teeth 17 for vertically aligning the clip portions B3 with the display device A. Thus, the clip portions B3 can be reliably aligned with the display device A for attachment thereto regardless of the length of the leads B1. In other words, as long as the pitch P between the leads B1 does not change, the guide rails 1, 2 including their respective extensions 1a, 7, the operating head 14, the support base 8 and other related parts need not be re-adjusted or replaced even if the leadframe B is replaced by a differently sized leadframe. This is very advantageous in reducing the manufacturing cost (including the cost of the apparatus itself) and simplifying the structure of the apparatus.

(2) The lead resting teeth 17, which are inserted between the respective leads B1 of the frame segment B', not only serve to provide a support or rest for vertically aligning the lead clip portions B3 with the display device A but also function to prevent the frame segment B' from deviating longitudinally relative to the display device A at the time of attaching the clip portions B3. Thus, the lead resting teeth 17 have an additional function of a positioner.

(3) The operating head 14 itself is removably mounted on the first reciprocative member 11 by means of the bolts 15. Thus, if the leadframe B is replaced by another which is different in lead pitch P, it is only necessary to replace the head 14 alone by another which is suitable for the new leadframe.

(4) The use of the presser member 25 enables forcible lowering of the frame segment B' until the lead clip portions B3 are vertically aligned with the display device A. Thus, it is always possible to insure accurate alignment even if the frame segment B' falls incompletely.

(5) The leadframe B is transferred by the pair of transfer rollers 3, 4 which cause movement of the leadframe only by friction. This transfer means is more advantageous than the conventional arrangement wherein the leadframe B with its side band B having constantly spaced indexing holes (punch holes) is transferred by a feed wheel or sprocket having corresponding teeth in engagement with the indexing holes. Indeed, the conventional transfer means requires replacement of the feed wheel when the leadframe B is replaced by another leadframe with differently spaced indexing holes, whereas the frictional transfer means can be applied to any kinds of leadframes.

(6) The sensor 29 is used to count the leads B1 which have advanced past the cutting position, and the signal from the sensor is utilized to stop transfer of the leadframe B via the controller 30. Indeed, the use of the sensor 29 enables direct counting of the leads and provides more accurate feeding of the leadframe than relying on the rotational amount of the drive mechanism 5 for transfer control of the leadframe.

The invention being thus described, it is obvious that the same may be varied in many ways. For instance, use can be additionally made of a belt conveyor arranged in parallel to the leadframe transfer path on one side thereof for successively supplying display devices onto the support base 8. Further, the row of lead resting teeth 17 may be replaced by a simple support or resting strip when each lead B1 has a projection or projections directed oppositely to the clip portion B3. Such variations are not to be regarded as a departure from the spirit and scope of the invention, and all such modifications as would be obvious to those skilled in the art are intended to be included within the scope of the following claims.

I claim:

1. An apparatus for mounting leads to an object, particularly an electronic component, requiring lead connection by utilizing a leadframe which comprises a side band formed integrally with leads substantially at constant pitch, each lead having a clip end portion, the apparatus comprising:

transfer means for transferring the leadframe with the respective clip end portions directed upward and located above the object which is supported on one side of the leadframe transfer path;

cutter means for cutting the leadframe to provide a frame segment which contains a predetermined number of leads required for the object, the frame segment being allowed to descend after the cutting;

an operating head arranged ahead of the cutter means on the other side of the leadframe transfer path in opposition to the supported object, the operating head being movable toward and away from the object; and lead resting means provided on the operating head for limiting descending movement of the frame segment and supporting the frame segment with the clip end portions thereof vertically aligned with the object.

2. The apparatus according to claim 1, wherein the lead resting means comprises a row of lead resting teeth insertable between the leads of the frame segment with the clip end portions supported on the lead resting teeth.

3. The apparatus according to claim 1, wherein the operating head has a pressing face for pressing the lead clip end portions of the frame segment into fitting engagement with the object when the head moves toward the object.

4. The apparatus according to claim 1, further comprising a presser member located above the head and the frame segment, the presser member being vertically movable for forcibly depressing the frame segment until the lead clip end portions thereof rest completely on the lead resting means.

5. The apparatus according to claim 4, wherein the presser member is always urged downward by a spring but movable upward by actuating means.

6. The apparatus according to claim 1, further comprising a sensor for counting the leads which have been transferred past the cutter means, and a controller responsive to the sensor for interrupting the transfer means when the sensor has counted a predetermined number of leads.

7. The apparatus according to claim 6, wherein the transfer means comprises at least one pair of transfer rollers for frictionally feeding the leadframe therebetween, at least one of the transfer rollers being driven by a drive mechanism.

8. The apparatus according to claim 1, wherein the operating head is removably fixed on a first reciprocative member which is reciprocally movable toward and away from the supported object.

9. The apparatus according to claim 8, wherein the cutter means comprises a pair of cutter members arranged on both sides of the leadframe transfer path, one of the cutter members being carried by the first reciprocative member.

10. The apparatus according to claim 8, further comprising: a stationary machine frame on which the first reciprocative member is slidably supported; a second reciprocative member which is reciprocally movable toward and away from the supported object under the machine frame; a guide plate carried by the second reciprocative member for movement therewith and positioned between the leadframe and the supported object, the guide plate being movable between an retreated position and an advanced position; urging means for always urging the guide plate toward the retreated position; first stopper means for preventing the guide plate from retreating beyond the retreated position; second stopper means for insuring a predetermined minimum distance between the guide plate and the first reciprocative member for allowing downward movement of the frame segment; and actuating means for holding the guide plate at the advanced position against the urging means even after the first reciprocative member moves away from the supported object.

* * * * *